United States Patent [19]

Dion et al.

[11] 4,399,411

[45] Aug. 16, 1983

[54] QUANTIZED VIDEO SIGNAL LEVEL INTERPOLATOR

[75] Inventors: Donald F. Dion, Burlington; Michael J. Cantella, Winchester, both of Mass.

[73] Assignee: RCA Corporation, New York, N.Y.

[21] Appl. No.: 304,379

[22] Filed: Sep. 22, 1981

[51] Int. Cl.³ .................... H03K 5/159; H04N 5/14; H03K 4/02; G09G 1/08

[52] U.S. Cl. ........................ 328/56; 328/53; 358/160; 340/728

[58] Field of Search ................ 358/160, 166, 167, 13, 358/141, 133, 138; 340/728, 347 CC; 333/138; 365/515; 375/26; 328/36, 53, 56, 186, 65; 307/261, 473

[56] References Cited

U.S. PATENT DOCUMENTS 2,266,154 12/1941 Blumlein ............................ 328/56
3,935,384 1/1976 Jirka ................................... 358/166
4,334,237 1/1982 Reitmeier ........................... 358/167

OTHER PUBLICATIONS

Lim, "Reduction of Quantization Noise in Pulse Code Modulation Image Coding", *Optical Engineering*, Jul.-/Aug. 1980, vol. 19, No. 4, pp. 577-580.

*Primary Examiner*—John C. Martin
*Attorney, Agent, or Firm*—J. S. Tripoli; R. L. Troike; R. E. Smiley

[57] ABSTRACT

A signal which changes from amplitude X to amplitude Z is applied to a resistor of value R which is series connected with an electrical L-C (inductor-capacitor) delay line unterminated at the opposite end and having a characteristic resistance of value R and one-way delay time T. An output terminal is coupled to the junction of the resistor and delay line. For a time duration 2 T after the input signal changes value, a signal of value $(X+Z) \div 2$ appears at the output terminal and thereafter a signal of value Z appears.

9 Claims, 6 Drawing Figures

QUANTIZED VIDEO SIGNAL LEVEL INTERPOLATOR

This invention relates to signal level interpolators and more particularly to such interpolators involving a delay line.

Many display systems involve the display of stored or otherwise provided quantized information representing different levels of intensity on the display screen. Where the number of given levels is small such as, for example, four, the resulting displayed image looks rather blocky and is often objectionable to the viewer. The obvious solution of increasing quantization levels is relatively costly in terms of additional memory and other hardware logic.

U.S. Pat. No. 4,127,873, issued Nov. 28, 1978 to K. Katagi, illustrates a digital video signal level interpolator which also involves a considerable number of logic circuits.

In accordance with a preferred embodiment of the invention, a quantized video signal level interpolator for interpolating at least one intermediate amplitude step into an input signal applied at an input terminal which changes from amplitude X to a different amplitude Z comprises a delay line of electrical length T and having a characteristic impedance value R and being unterminated at one end. A resistor of resistance value R is serially connected between the other end of the delay line and the input terminal and an output terminal is connected to the juncture of the resistor and delay line. When the input signal changes from amplitude X to amplitude Z, a signal of value between X and Z appears at the output terminal followed by a signal of value Z at time 2 T later.

Figure 3:
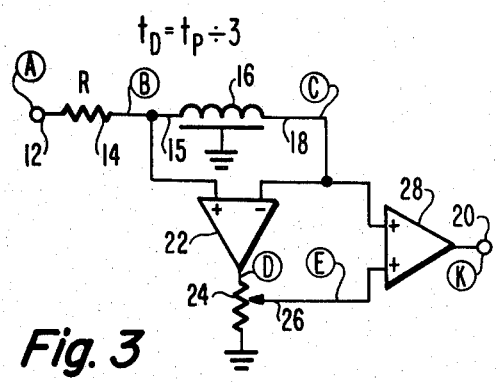
Figure 4:
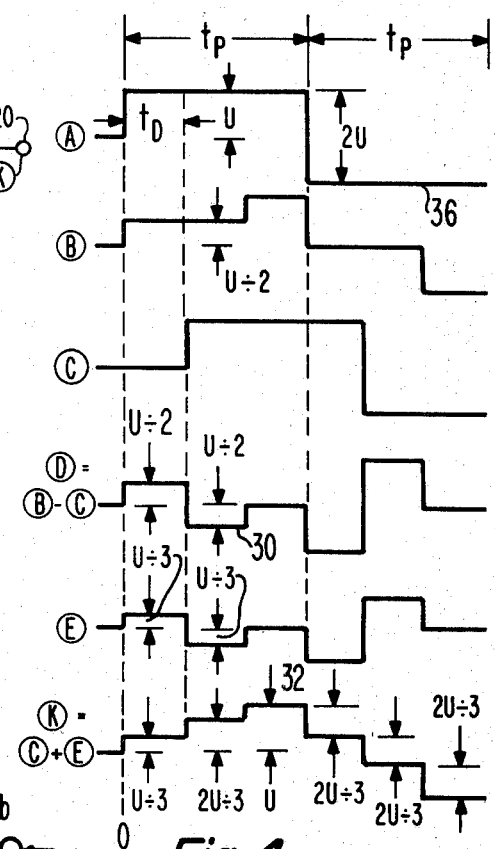
Figure 5:
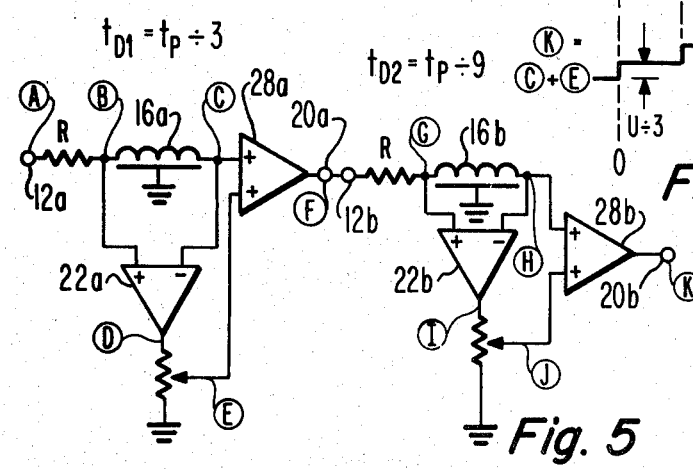
Figure 6:
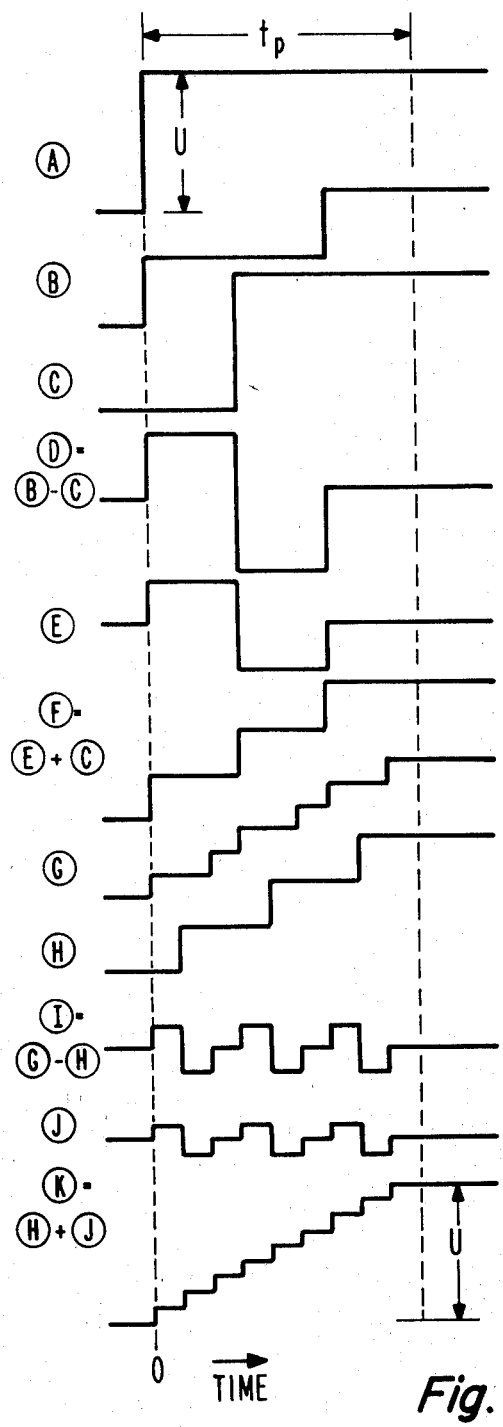

FIGS. 3 and 5 are interpolator circuits with two and eight interpolation levels, respectively in accordance with other preferred embodiments of the present invention; and FIGS. 4 and 6 are sets of waveforms useful in understanding the operation of the FIGS. 3 and 5 circuits, respectively.

Figure 1:
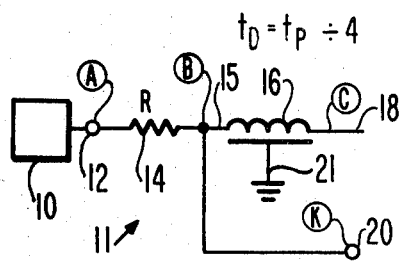
FIG. 1 is an interpolator circuit with one interpolation level in accordance with a preferred embodiment of the invention.

Referring now to FIG. 1, a number of encircled letters appear at various points in the figure. The letters relate to identically labeled waveforms in FIG. 2. Likewise, encircled letters in FIG. 3 relate to identically labeled waveforms in FIG. 4, and encircled letters in FIG. 5 relate to identically labeled waveforms in FIG. 6.

In FIG. 1 a source of digital signals 10, producing a succession of signals of different amplitudes in interger multiples of an amplitude U, is connected to an input terminal 12 of interpolator circuit 11. The signals produced by source 10 may relate to the intensity of a signal appearing on a conventional cathode ray tube type display screen (not shown) at various points on the screen. Input terminal 12 is series connected with a resistor 14 of resistance value R to one end 15 of an electrical L-C (inductor-capacitor) delay line 16. The distal end 18 of the delay line is unterminated. Resistor 14 acts as a terminating resistor for end 15 of delay line 16. The juncture of delay line 16 and resistor 14 is connected to output terminal 20. The delay line, which is connected to circuit ground at 21, has a characteristic resistance equal to R, and has a one-way electrical length equal to $t_D$. An exemplary delay line is manufactured by Data Delay Devices, 253 Crooks Avenue, Clifton, N.J. and sold as Model 2211-1500G having a characteristic resistance of 500 ohms and a one-way delay time of 1.5 microseconds.

Although not critical in the general application, when the input signal to terminal 12 represents video information to be displayed on a cathode ray tube type display device which displays digitally generated information in pixels each of duration $t_p$, then $t_D = t_P \div 4$.

Operation of the circuit of FIG. 1 will now be described with reference to the waveforms of FIG. 2. Assume a signal from source 10 applied between terminal 12 and circuit ground undergoes a positive change in amplitude of one unit U at time 0 from some lower amplitude X to some higher amplitude Y. See FIG. 2, waveform A (hereinafter waveform 2A). At time 0 unterminated end 18 of delay line 16 initially acts as though it is still connected to a signal of amplitude X due to the inductive-capacitive delay action of the L-C type delay line. Therefore, since the resistance value of R and of delay 16 are identical, the signal appearing at terminal 20 (waveform 2B or 2K) undergoes a one-half unit step change in amplitude. This signal propagates along delay line 16, reaching end 18 after a time $t_D$, at which time end 18 jumps up by the full unit amplitude change in signal to Y which signal then propagates back along delay line 16, reaching terminal 20, at time 2 $t_D$. At time 2 $t_D$ the potential at terminal 20 increases to the full unit amplitude. Therefore, one step applied at terminal 12 has been interpolated into two steps at terminal 20.

Figure 2:
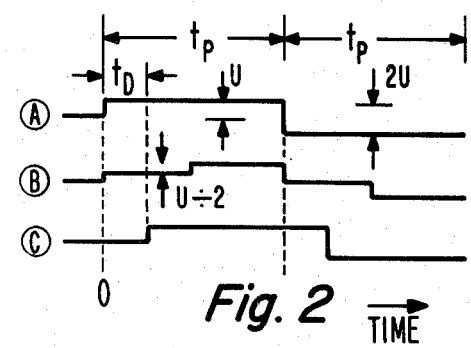
FIG. 2 is a set of waveforms useful in understanding the operation of the FIG. 1 circuit.

As a further example, if at time $t_P$ the signal produced by source 10 decreases by two units in amplitude, the signal at terminal 20 will immediately decrease by a unit amplitude amount followed, at time duration 2 $t_D$ later, by a decrease of an additional unit amplitude, as illustrated in the waveforms of FIG. 2. Thus, in summary, the circuit of FIG. 1 interpolates a step of amplitude to an intermediate level, any change in amplitude of the signal applied by source 10. The intermediate step terminates at a point one half of the time $t_P$ which, as indicated before, is the pixel time.

Referring now to FIG. 3, a two-step interpolator includes resistor 14 and delay line 16 as in FIG. 1. In the application where input signals are in the form of pixels, the one-way delay time $t_D$ is equal to one-third of the pixel time. The unterminated end 18 of the delay line 16 is connected to the negative input of a differential operational amplifier 22 while the other end 15 is connected to the positive input of amplifier 22. An amplitude divider circuit such as a potentiometer 24 is series connected between the output of amplifier 22 and circuit ground. The tap 26 of the potentiometer is connected to one input of a summing operational amplifier 28 while end 18 of delay line 16 is connected to the other input. The output of amplifier 28 is connected to output terminal 20. Tap 26 is adjusted to pass to amplifier 28 two-thirds of the signal present at the output of amplifier 22. The operation of the circuit of FIG. 3 will now be described with reference as appropriate to the waveforms of FIG. 4. As with the circuit of FIG. 1, assume that the signal applied to input terminal 12 is increased by a unit amount U at time 0. Thus, since delay line 16 exhibits a characteristic resistance R, end 15 of delay line 16 changes in amplitude by one-half U. Differential amplifier 22 causes the signals at the unterminated end 18 to be subtracted from the signal at end 15 such that the signal at the output of amplifier 22 increases by one-half U and the signal at tap 26 increases by one-third U. Further, since, as stated above, there is no change in value of signal at unterminated end 18, the output signal at terminal 20 increases by one-third U.

At a time $t_D$ the one-half unit change in amplitude signal has progressed to the unterminated end 18 of delay line 16 which then jumps to a full unit change in amplitude while end 15 still remains at the one-half U increase in amplitude. Thus, as illustrated in waveform D, the signal from amplifier 22 decreases by one-half U in amplitude and consequently the signal at tap 26 decreases by one-third U in amplitude. The signals produced at tap 26 and end 18 of delay line 16 are algebraically added in amplifier 28 to produce the signal at terminal 20 which is increased by one-third U. After an additional time duration $t_D$, that is 2 $t_D$ after terminal 12 underwent the unit step increase in amplitude, the unit step signal has returned to end 15 of delay line 16 such that ends 15 and 18 are the same amplitude and the signal at tap 26 is of zero amplitude. Therefore, the signal at terminal 20 increases by a full unit step in amplitude. See waveform K, region 32.

If thereafter the signal applied at terminal 12 decreases by 2 U in amplitude, as illustrated in region 36 of waveform A, the circuit of FIG. 3 acts to decrease the signal at output terminal 20 by 2 U in three equal steps of two-thirds U each as illustrated in waveform K.

The circuit of FIG. 3 is similar in appearance although not in operation to an aperture corrector circuit commonly used in cathode ray imaging systems to compensate for known fall-off in frequency response of the system camera or display tube because of the finite size of the scanning (aperture) beam.

An aperture corrector circuit differs from the circuit of FIG. 3 in that ends 15 and 18 of delay line 16 would be connected, respectively, to the − and + inputs of a differential amplifier 22 rather than the + and − inputs as in FIG. 3. With that difference the operation of and waveforms produced by an aperture corrector circuit differ substantially from that of the FIG. 3 circuit. Further, the purpose of the two circuits is entirely different. The aperture corrector serves to enhance an input signal while the instant circuit serves to filter or de-emphasize changes in an input signal.

Refer now to FIG. 5 which illustrates an eight-step interpolator and comprises two circuits identical to that of FIG. 3 in series connection. In FIG. 5 the one-way time in delay line 16 is $t_P \div 3$ and the one-way delay in delay line 16b is $t_P \div 9$. Since the operation of the FIG. 5 circuit is similar to that of the FIG. 3 circuit, its operation will not be described. The waveforms of FIG. 6 illustrate the changes in signals at the various points in FIG. 5 following a unit step U amplitude increase in input signal at terminal 12a. Note from waveform 6 K that eight steps are interpolated between the original signal just prior to time zero and the final signal 8/9 $t_P$ later.

What is claimed is:

1. A quantized signal level interpolator for interpolating at least one intermediate amplitude step into an input signal applied to an input terminal which signal changes from a first amplitude X to a second different amplitude Z, comprising in combination:

a delay line of electrical length T with characteristic resistance value R and being unterminated at one end;

a resistor series connected between said input terminal and other end of said delay line and being of value R;

an output terminal coupled to said other end of said delay line, whereby when said input signal changes from amplitude X to amplitude Z a signal of amplitude intermediate X and Z appears at said output terminal until a time 2 T later when a signal of amplitude Z appears; and means responsive to the signals appearing at both ends of said delay line for producing a difference signal, corresponding to the sum of the signal at said other end and inverse of said signal at said one end and means having an output connected to said output terminal and responsive to said difference signal and signal at said one end for producing a signal which corresponds to the sum of those two signals.

2. The combination as set forth in claim 1, wherein said difference signal producing means comprises a differential amplifier producing a signal which is the difference of signals applied thereto from said delay line, and a potential divider having an intermediate tap and being connected between the output of said differential amplifier and circuit ground, said tap being connected to one input of said summing means.

3. The combination as set forth in claim 1 further comprising a second interpolator circuit similar to the first interpolator circuit and having its input terminal connected to said output terminal of said first circuit, the time delay of the delay line of the first circuit being equal to three times the delay time of the second delay line.

4. The combination as set forth in claim 2 further comprising a second interpolator circuit similar to the first interpolator circuit and having its input terminal connected to said output terminal of said first circuit, the time delay of the delay line of the first circuit being equal to three times the delay time of the second delay line.

5. A quantized signal level interpolator for interpolating at least one intermediate amplitude step into an input signal applied to an input terminal, comprising in combination:

means producing a digital signal which, from time to time, abruptly changes from one value to another, said means producing a signal which abruptly changes from a first amplitude X to a second different amplitude Z;

a delay line of electrical length T with characteristic resistance value R and being unterminated at one end;

impedance means series connected between said input terminal and other end of said delay line and having a resistive value R and having no reactive value; and an output terminal coupled to said other end of said delay line, said electrical length T being selected so that when said input signal changes from amplitude X to amplitude Z a signal of amplitude intermediate X and Z appears at said output terminal until a time 2 T later when a signal of amplitude Z appears.

6. The combination as set forth in claim 5 wherein said interpolator further comprises means responsive to the signals appearing at both ends of said delay line for producing a difference signal, corresponding to the sum of the signal at said other end and inverse of said signal at said one end and means having an output connected to said output terminal and responsive to said difference signal and signal at said one end for producing a signal which corresponds to the sum of those two signals.

7. The combination as set forth in claim 6 wherein said difference signal producing means comprises a differential amplifier producing a signal which is the difference of signals applied thereto from said delay line, and a potential divider having an intermediate tap and being connected between the output of said differential amplifier and circuit ground, said tap being connected to one input of said summing means.

8. The combination as set forth in claim 6 further comprising a second interpolator circuit similar to the first interpolator circuit and having its input terminal connected to said output terminal of said first circuit, the time delay of the delay line of the first circuit being equal to three times the delay time of the second delay line.

9. The combination as set forth in claim 7 further comprising a second interpolator circuit similar to the first interpolator circuit and having its input terminal connected to said output terminal of said first circuit, the time delay of the delay line of the first circuit being equal to three times the delay time of the second delay line.

* * * * *